(12) United States Patent
Hayashi

(10) Patent No.: US 8,038,836 B2
(45) Date of Patent: Oct. 18, 2011

(54) PLASMA PROCESSING APPARATUS

(75) Inventor: Daisuke Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 519 days.

(21) Appl. No.: 12/202,658

(22) Filed: Sep. 2, 2008

(65) Prior Publication Data

US 2009/0084502 A1 Apr. 2, 2009

Related U.S. Application Data

(60) Provisional application No. 60/991,820, filed on Dec. 3, 2007.

(30) Foreign Application Priority Data

Sep. 28, 2007 (JP) ................................ 2007-256561

(51) Int. Cl.
*C23C 16/00* (2006.01)
*C23F 1/00* (2006.01)
*H01L 21/306* (2006.01)

(52) U.S. Cl. ......... 156/345.35; 118/723 E; 118/723 ER; 118/723 MW; 118/723 ME; 118/723 MR; 118/723 I; 118/723 IR; 156/345.19; 156/345.43; 156/345.44; 156/345.47

(58) Field of Classification Search ............. 156/345.35, 156/345.43, 345.44, 345.47; 118/723 E, 118/723 ER, 723 I, 723 IR
See application file for complete search history.

(56) References Cited

U.S. PATENT DOCUMENTS

| | | | | |
|---|---|---|---|---|
| 6,093,281 A * | 7/2000 | Wise et al. | ............... | 156/345.29 |
| 6,170,431 B1 * | 1/2001 | DeOrnellas et al. | ........ | 118/723 I |
| 6,197,165 B1 * | 3/2001 | Drewery et al. | ......... | 204/192.12 |
| 6,250,880 B1 * | 6/2001 | Woodard et al. | ........... | 415/182.1 |
| 2004/0028837 A1 * | 2/2004 | Fink | .............................. | 427/575 |

FOREIGN PATENT DOCUMENTS

| | | |
|---|---|---|
| JP | 2002-83803 | 3/2002 |
| JP | 2006-73722 | 3/2006 |
| WO | WO 2006/025123 A1 | 3/2006 |

* cited by examiner

*Primary Examiner* — Parviz Hassanzadeh
*Assistant Examiner* — Rakesh Dhingra
(74) *Attorney, Agent, or Firm* — Oblon, Spivak, McClelland, Maier & Neustadt, L.L.P.

(57) ABSTRACT

A plasma processing apparatus includes a barrier wall member disposed between a plasma generation chamber and a processing chamber to separate the plasma generation chamber from the processing chamber. The barrier wall member assumes a fin structure achieved by disposing in a radial pattern numerous plate-like fin members extending from a central area thereof toward a peripheral edge. An upper end portion of each fin member overlaps a lower end portion of an adjacent fin member. The fin members are disposed with gaps formed between them and are made to range upward with a tilt along the circumferential direction.

6 Claims, 12 Drawing Sheets

PLASMA PROCESSING APPARATUS

CROSS-REFERENCE TO RELATED APPLICATIONS

This document claims priority to Japanese Patent Application Number 2007-256561, filed on Sep. 28, 2007 and U.S. Provisional Application No. 60/991,820, filed on Dec. 3, 2007, the entire content of which are hereby incorporated by reference.

FIELD OF THE INVENTION

The present invention relates to a plasma processing apparatus that executes a specific type of processing on a processing target substrate with radicals generated by exciting a processing gas to plasma.

BACKGROUND OF THE INVENTION

During a manufacturing process for manufacturing, for instance, semiconductor devices, a specific film formed on a processing target substrate such as a semiconductor wafer (hereafter may be simply referred to as a "wafer") is selectively etched and removed by using a resist film formed at the surface of the wafer as a mask and then the resist film is removed through ashing. During the ashing process, oxygen radicals generated by exciting an oxygen-containing gas to a plasma state are used in the related art. As semiconductor elements today need to assume a multilayer structure with a greater number of wiring layers stacked one on top of another, a low dielectric constant film with a low dielectric constant, such as a low-k film, is frequently used as an insulating film in the multilayer wiring structure. Since such a low dielectric constant insulating film is readily damaged by oxygen radicals, hydrogen radicals with which damage can be more successfully inhibited are utilized when etching or ashing the low dielectric constant insulating film.

The plasma processing apparatuses that process wafers with radicals in the related art include those adopting a structure equipped with a plasma generation chamber where plasma is generated by exciting a processing gas and a processing chamber communicating with the plasma generation chamber (see, for instance, patent reference literatures 1 and 2 listed below). Since ions that are sure to damage films on a wafer are formed, in addition to radicals, from the plasma generated in the plasma generation chamber, a barrier wall member via which ions traveling from the plasma generation chamber toward the processing chamber are trapped but radicals are allowed to pass through is disposed between the plasma generation chamber and the processing chamber, in order to process the wafer with the radicals while minimizing damage to the wafer.

The barrier wall member in the related art is constituted with a single barrier wall plate with through holes formed therein, which is disposed with a horizontal orientation. However, at the barrier wall member constituted with a single barrier wall plate, the through holes formed to let through the radicals are unblocked, giving rise to a concern that ultraviolet light (including vacuum ultraviolet light) generated as the processing gas is raised to plasma in the plasma generation chamber may be transmitted through the through holes. If the ultraviolet light is transmitted through the through holes and is directly radiated over the surface of the wafer, films deposited upon the wafer may become damaged and accordingly, the wafer needs to be shielded from the ultraviolet light. For instance, if a low-k film is formed on the wafer, the Si—C bond in the low-k film is broken by the ultraviolet light, allowing carbon to separate, which will result in an increase in the dielectric constant of the film. In addition, the low-k film will be rendered more hydrophilic and the water content in the film will increase to result in a decrease in the mechanical strength of the film.

These issues may be addressed as disclosed in patent reference literature 1 listed below by constituting the barrier wall member with two barrier wall plates disposed with a horizontal orientation, which are stacked one on top of the other with a clearance formed between them and by setting the through holes formed at the individual barrier wall plates with an offset, so as to disallow transmission of ultraviolet light.

There is an issue yet to be addressed with regard to a barrier wall member constituted with a barrier wall plate disposed with a horizontal orientation as described earlier, in that since radicals collide with the surface of the barrier wall plate substantially at a right angle to the surface and thus tend to become lost after the collision, they cannot pass through the barrier wall plate with a high level of efficiency. Since such a reduction in the quantity of radicals passing through the barrier wall plate is bound to result in a decrease in the quantity of radicals that actually reach the wafer, the processing rate at which the wafer is processed with the radicals, e.g., the etching rate, the ashing rate or the film formation rate, will be lowered.

While the quantity of radicals passing through a barrier wall member constituted with a single barrier wall plate may be increased by forming a greater number of through holes or by forming larger through holes, ultraviolet light will be transmitted readily through such through holes. In addition, while the passage of ultraviolet light can be prevented more effectively with a barrier wall member constituted with a plurality of barrier wall plates, a significant quantity of radicals is likely to be lost through collisions, as, for instance, radicals having passed through the through holes at a barrier wall plate collide with the surface of another barrier wall plate located under the first barrier wall plate.

There is another concern in that the ease with which the gas flows as it passes through a barrier wall plate disposed with a horizontal orientation and having through holes formed therein, i.e., the conduction of gas, cannot be readily adjusted. For instance, as the processing gas flows at a higher flow rate, the flow velocity over a central area of the barrier wall plate will become higher than the flow velocity at the periphery of the barrier wall plate and the overall flow velocity distribution will assume a substantially parabolic curve. Under such circumstances, the radicals having reached the wafer will be distributed in different quantities at the central area and the peripheral area, which is bound to compromise the in-plane uniformity of the wafer processing. For these reasons, it is desirable to adjust the flow velocity of the gas passing through the barrier wall plate by adjusting the conduction at the barrier wall plate.

The conduction at the barrier wall plate may be adjusted by altering the quantity or size of the through holes. However, it is not easy to determine the optimal quantity or size of through holes for achieving the desired gas flow velocity distribution and thus, the conduction cannot easily be fine-adjusted. In addition, such a change in the quantity or size of through holes will necessitate replacement of the barrier wall plate itself. In short, conduction adjustment generally requires a great deal of attention and labor.

(patent reference literature 1) Japanese Laid Open Patent Publication No. 2006-073722
(patent reference literature 2) Japanese Laid Open Patent Publication No. 2002-083803

SUMMARY OF THE INVENTION

Accordingly, an object of the present invention having been achieved by addressing the issues discussed above, is to provide a plasma processing apparatus equipped with a barrier wall member with which radicals alone, generated from plasma formed in a plasma generation chamber, can be selectively supplied into a processing chamber with a high level of efficiency by blocking ultraviolet light and ions also generated from the plasma and the conduction can be adjusted with ease.

The object described above is achieved in an aspect of the present invention by providing a plasma processing apparatus that executes a specific type of processing on a processing target substrate with radicals generated by raising a processing gas to plasma, comprising a plasma generation chamber where plasma is generated by exciting the processing gas, a processing chamber disposed continuously to the plasma generation chamber, a stage disposed inside the processing chamber, upon which the processing target substrate is placed and a barrier wall member separating the plasma generation chamber from the processing chamber. The barrier wall member is formed by disposing in a radial pattern numerous plate-like fin members extending from a central area of the barrier wall member toward the peripheral edge, the fin members are positioned so that an upper end portion of each fin member overlaps a lower end portion of an adjacent fin member and the fin members each range upward with a tilt along a circumferential direction with a gap formed between the fin member and the adjacent fin member.

According to the present invention described above, in which numerous fin members are disposed in a radial pattern with the upper end portion of each fin member overlapping the lower end portion of the adjacent fin member and gaps present between the fin members, the space under the fin members becomes invisible in a plan view. Thus, ultraviolet light and ions, among the ultraviolet light, the ions and the radicals generated as the processing gas is raised to plasma and flowing toward the individual fin members, which tend to advance only in linear propagation, cannot pass through the fin members and are instead blocked at the surfaces of the fin members. The radicals, on the other hand, do not readily advance in linear propagation and are thus allowed to pass through the gaps between the individual fin members with ease. Consequently, the specific processing can be executed on the processing target substrate with the radicals alone, without damaging the processing target substrate with the ultraviolet light or the ions.

Since the fin members are disposed so as to range upward with a tilt, the radicals traveling through the gaps between the fin members do not readily collide with the wall surfaces of the fin members. Even if collisions occur, the likelihood of radicals colliding perpendicular to the fin member wall surfaces is extremely low and thus, a radical loss does not occur readily. As a result, radicals are allowed to travel through the barrier wall member with a higher level of efficiency compared to the related art.

The size of the gaps between the fin members can be adjusted easily simply by altering the tilt angle with which the fin members tilt and ultimately, the conduction of gas passing through the gaps can be adjusted with ease. Furthermore, since the fin member tilt angle can be fine-adjusted, the conduction, too, can be fine-adjusted. Consequently, the flow of gas passing through the gaps between the fin members can be adjusted easily to achieve the desired flow velocity distribution.

The fin members may each assume a shape with an upper end portion thereof sustaining a uniform height over an area ranging, for instance, from a central area toward a periphery. By disposing such fin members in a radial pattern so that they range upward with a tilt, gaps that are narrowest on the central side and gradually widen toward the peripheral side are formed between the fin members. In this case, a gas flow distribution whereby the flow velocity over the central area is kept down but a higher flow velocity is assured over the peripheral area, can be achieved for the gas having passed through the gaps between the fin members which, in turn, makes it possible to achieve a uniform flow velocity distribution instead of, for instance, a parabolic flow velocity distribution.

Alternatively, the fin members may each assume a shape the height of an upper end portion of which changes over an area ranging from a central side toward a peripheral side or are they may each assume a shape, the height of an upper end portion of which remains constant at a portion thereof but changes at another portion thereof, over an area ranging from a central side toward a peripheral side. By using fin members with the upper end portions thereof having a height that does not remain constant as described above, the desired flow velocity distribution can be achieved for the gas yet to pass through the gaps between the fin members.

A support member that supports the fin members so that the tilt angle of the fin members can be adjusted freely may be disposed in conjunction with the fin members. Such a support member may be constituted with, for instance, an upper or support member and a lower support member tiltably supporting the fin members on an upper side and on a lower side, by holding central-side ends and peripheral-side ends of the fin members. As the upper support member and the lower support member are rotated relative to each other, the tilt angle of the fin members can be altered all at once. In such a case, the conduction can be adjusted with ease without having to replace the fin members.

The upper support member may include a disk-shaped upper inner plate and a ring-shaped upper outer plate and the lower support member may include a disk-shaped lower inner plate and a ring-shaped lower outer plate. In such a case, as the central-side ends of the fin members are fitted with play inside grooves formed at the outer peripheral edges of the upper inner plate and the lower inner plate and the peripheral-side ends of the fin members are fitted with play inside grooves formed at the inner peripheral edges of the upper outer plate and the lower outer plate, the fin members become tiltably supported. This structure allows the conduction to be adjusted with ease simply by rotating the upper support member relative to the lower support member. Furthermore, since the tilt angle of the fin members can be altered linearly as the upper support member rotates, the conduction can be fine-adjusted easily.

In addition, through holes may be formed at both the upper inner plate and the lower inner plate, with the through holes at the upper inner plate and the through holes at the outer lower inner plate set with an offset so as to be not aligned with each other in a plan view. In this case, radicals can be selectively delivered into the processing chamber even through the area blocked off by the upper inner plate and the lower inner plate, by blocking only the ultraviolet light and the ions generated from the plasma formed in the plasma generation chamber.

According to the present invention, radicals alone can be selectively delivered into the processing chamber by effectively blocking ultraviolet light and ions generated from plasma formed in the plasma generation chamber, the radicals are allowed to pass through with a very high level of efficiency and the conduction can be adjusted with ease.

DETAILED DESCRIPTION OF THE PREFERRED EMBODIMENT

Figure 1:
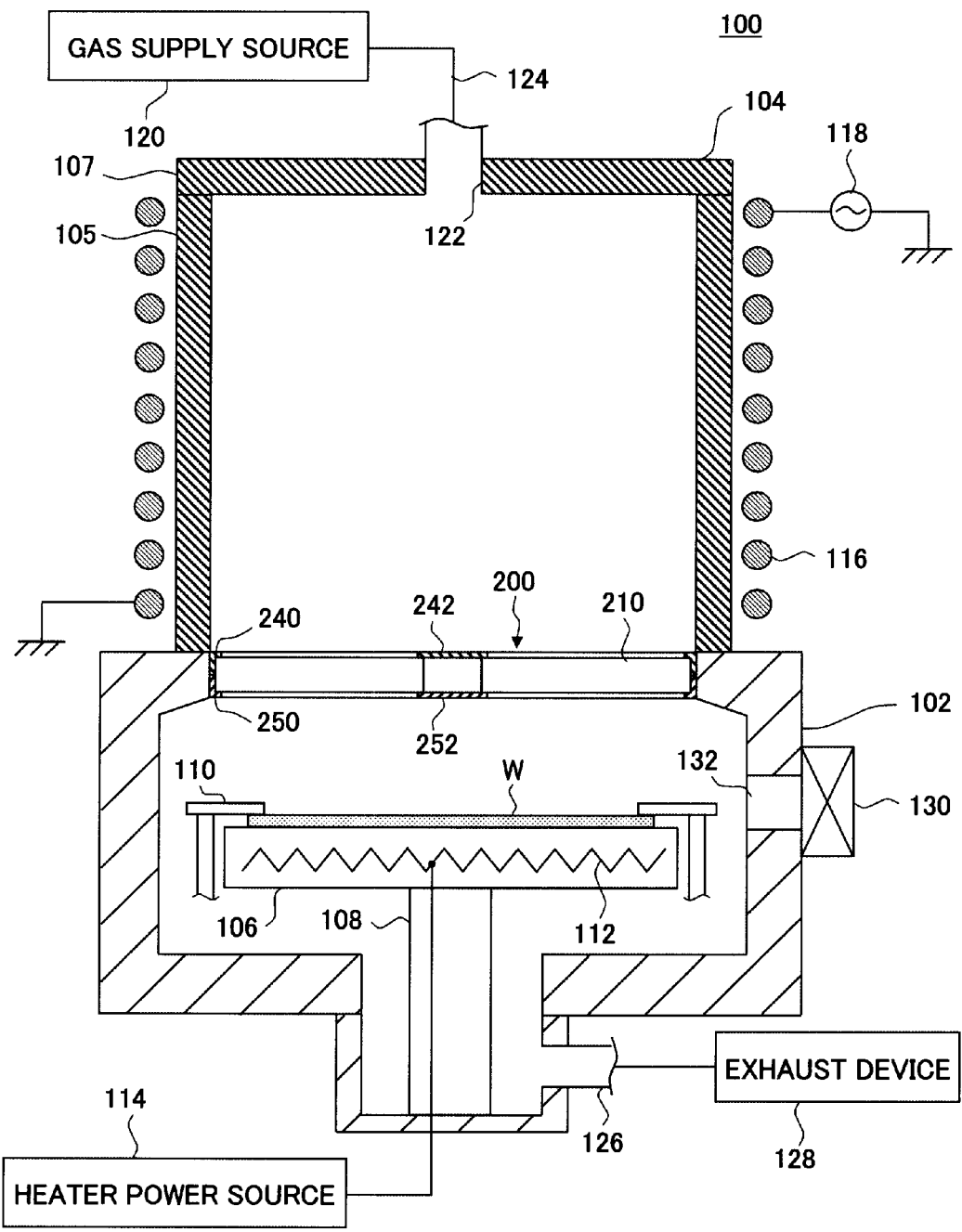
FIG. 1 is a longitudinal sectional view, schematically illustrating the structure adopted in the plasma processing apparatus achieved in an embodiment of the present invention.

The following is a detailed explanation of a preferred embodiment of the present invention, given in reference to the attached drawings. It is to be noted that in the description and the drawings, the same reference numerals are assigned to components having substantially identical functions and structural features to preclude the necessity for a repeated explanation thereof.

(Structural Example for the Plasma Processing Apparatus)

First, in reference to a drawing, a structural example that may be adopted in the plasma processing apparatus achieved in an embodiment of the present invention is explained. The following explanation is provided by assuming that the present invention is adopted in a down-flow type plasma processing apparatus that processes substrates by using hydrogen radicals generated from plasma (hereafter may be referred to as "hydrogen plasma") raised from a hydrogen-containing processing gas. FIG. 1 is a longitudinal sectional view schematically illustrating the structure of the plasma processing apparatus 100 achieved in the embodiment. In the plasma processing apparatus 100, a photoresist film formed on a low dielectric constant insulating film with a lower dielectric constant, such as a low-k film, is removed through ashing by supplying hydrogen radicals over to a wafer W having the lower dielectric constant insulating film formed thereupon.

As shown in FIG. 1, the plasma processing apparatus 100 includes a processing chamber 102 where the wafer W is processed and a plasma generation chamber 104 communicating with the processing chamber 102, where plasma is generated by exciting a processing gas. The plasma generation chamber 104, located above the processing chamber 102, is structured so that plasma is generated through an inductively coupled plasma method from the processing gas delivered therein.

More specifically, the plasma generation chamber 104 includes a substantially cylindrical reaction container 105 constituted of an insulating material such as quartz or ceramic. The top of the reaction container 105 is sealed off with a detachable lid 107 so as to assure a high level of airtightness. A gas delivery port 122 is formed at the lid 107 and a specific type of processing gas originating from a gas supply source 120 is delivered into the internal space of the plasma generation chamber 104 via the gas delivery port 122. Although not shown, a switching valve via which a gas piping 124 is opened/closed, a mass flow controller that regulates the flow rate of the processing gas and the like are disposed at the gas piping 124 connecting the gas supply source 120 to the gas delivery port 122.

The processing gas is a hydrogen-containing gas with which hydrogen radicals (H*) can be generated. Such a processing gas may be constituted with hydrogen gas alone or it may be a mixed gas containing hydrogen gas and an inert gas. The inert gas in the mixed gas may be, for instance, helium gas, argon gas or neon gas. It is to be noted that when a mixed gas containing hydrogen gas and an inert gas is used as the processing gas, the hydrogen gas should be mixed with a mixing ratio of, for instance, 4%.

A coil 116 to be used as an antenna member is wound around the outer circumference of the reaction container 105. A high-frequency power source 118 is connected to the coil 116. High-frequency power with its frequency set in a range of 300 kHz~60 MHz can be output from the high-frequency power source 118. As specific high-frequency power with a frequency of, for instance, 450 kHz is supplied from the high-frequency power source 118 to the coil 116, an induction field is formed inside the plasma generation chamber 104. As a result, the processing gas delivered into the processing chamber 102 becomes excited and is raised to plasma.

A disk-shaped stage 106, upon which a wafer W can be supported levelly, is disposed inside the processing chamber 102. The stage 106 is supported by a cylindrical support member 108 disposed at the bottom of the processing chamber 102. The stage 106 is constituted of ceramic such as aluminum nitride. In addition, a heater 112 that heats the wafer W is installed within the stage 106. As power is supplied to the heater 112 from a heater power source 114, the heater 112 heats the wafer W to a predetermined temperature (e.g., 300° C.). It is desirable that the predetermined temperature be set within a relatively high temperature range of, for instance, 250° C.~400° C., over which the low dielectric constant insulating film remains substantially undamaged.

An exhaust pipe 126 is connected to the bottom wall of the processing chamber 102 and an exhaust device 128, which includes a vacuum pump, is connected to the exhaust pipe 126. As the exhaust device 128 is engaged in operation, the pressure in the processing chamber 102 and the plasma generation chamber 104 can be lowered to achieve a predetermined degree of vacuum.

At the side wall of the processing chamber 102, a transfer port 132 that can be opened/closed via a gate valve 130 is formed. The wafer W is carried into/out of the processing chamber via a transfer mechanism such as a transfer arm (not shown).

The edge of the open bottom of the reaction container 105 constituting the plasma generation chamber 104 is set at the edge of the open top of the processing chamber 102. Near the position at which the reaction container is mounted at the processing chamber, a barrier wall member 200 is detachably installed so as to separate the processing chamber 102 from the plasma generation chamber 104. The barrier wall member 200 may be mounted at the inner wall at the edge of the opening at the processing chamber 102, as shown in FIG. 1. It is to be noted that the mounting position of the barrier wall member 200 is not limited to that shown in FIG. 1. As long as it separates the plasma generation chamber 104 from the processing chamber 102, it may be installed at the plasma generation chamber 104 or it may be installed astride both the plasma generation chamber 104 and the processing chamber 102.

The barrier wall member 200 is structured so that only hydrogen radicals generated as a hydrogen-containing processing gas is excited to plasma in the plasma generation chamber 104, are allowed to pass through the barrier wall member. Namely, as the hydrogen-containing processing gas is excited and plasma is generated, hydrogen radicals, hydrogen ions, ultraviolet light and the like are formed. Of these, the hydrogen ions and the ultraviolet light are blocked at the barrier wall member and the hydrogen radicals alone are allowed to pass through toward the processing chamber 102 via the barrier wall member. It is to be noted that specific examples of the barrier wall member 40 are to be described later.

A wafer W to be processed with hydrogen radicals in the plasma processing apparatus 100 structured as described above is first carried into the processing chamber 102 through the transfer port 132 by opening the gate valve 130. Once the wafer W is placed in the processing chamber 102, it is transferred onto the stage 106.

Subsequently, the gate valve 130 is closed and the processing chamber 102 and the plasma generation chamber 104 are evacuated via the exhaust device 128 until the pressure inside is reduced to a predetermined degree of vacuum. In addition, the level of power to be supplied from the heater power source 114 to the heater 112 is selected so as to heat the wafer W to a predetermined temperature (e.g., 300° C.).

Then, high-frequency power (e.g., 4000 W) is supplied to the coil 116 from the high-frequency power source 118 while supplying the processing gas constituted with a hydrogen-containing gas from the gas supply source 120 into the plasma generation chamber 104 via the gas delivery port 122, thereby forming an induction field inside the plasma generation chamber 104 and consequently generating hydrogen plasma inside the plasma generation chamber 104.

Ultraviolet light, hydrogen ions and hydrogen radicals are formed from the hydrogen plasma. Of these, the ultraviolet light and the hydrogen ions are blocked at the barrier wall member 200 and the hydrogen radicals alone are allowed to pass through the barrier wall member. Thus, a desired type of processing such as ashing of a photoresist film present on the wafer W can be executed by using the hydrogen radicals alone without damaging the surface of the wafer W in the processing chamber 102 with the ultraviolet light or the hydrogen ions. This advantage is particularly significant when a low dielectric constant insulating film with a low dielectric constant, such as a low-k film, is formed on the wafer W, since the low dielectric constant film, readily damaged by ultraviolet light and hydrogen ions, is effectively protected by blocking the ultraviolet light and the hydrogen ions.

It is to be noted that while an explanation is given above on an example in which the hydrogen plasma is generated in the plasma generation chamber 104 through the inductively coupled plasma method, the present invention is not limited to this example and hydrogen plasma may be generated instead through, for instance, a microwave excitation method.

(Structural Examples for the Barrier Wall Member)

Figure 2:
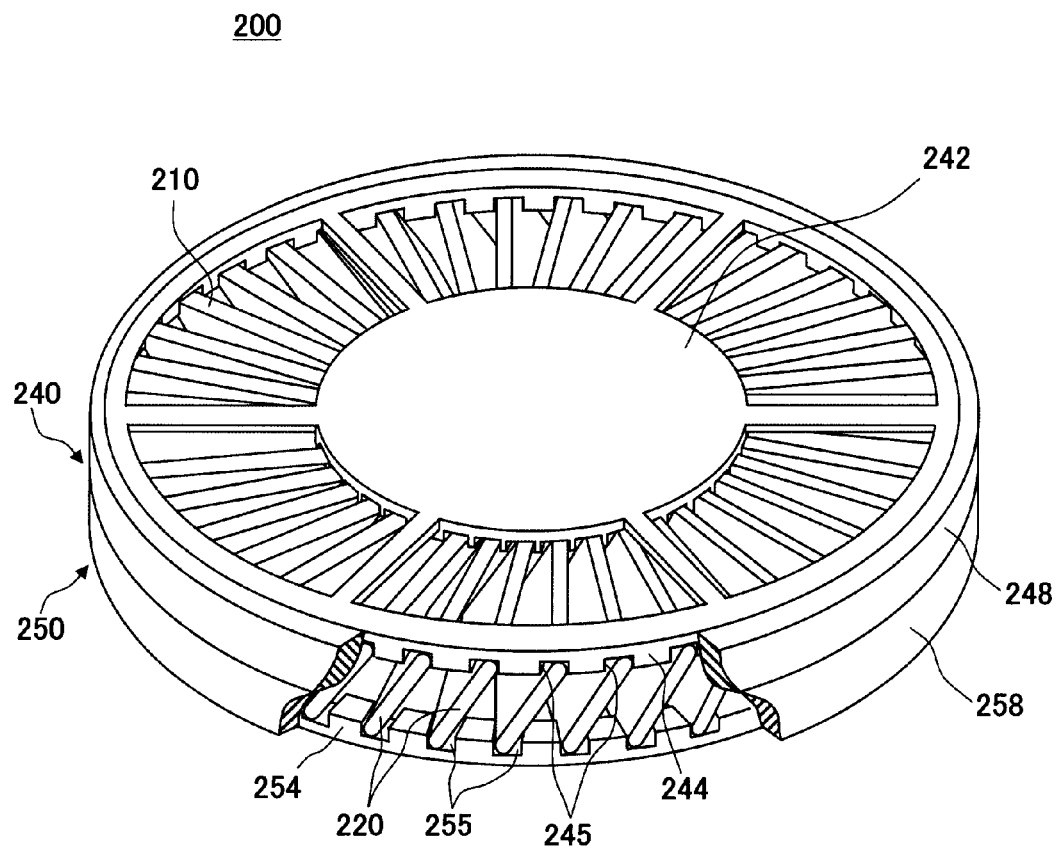
FIG. 2 presents an external view of a barrier wall member achieved in the embodiment, schematically illustrating its structure in a perspective.
Figure 3:
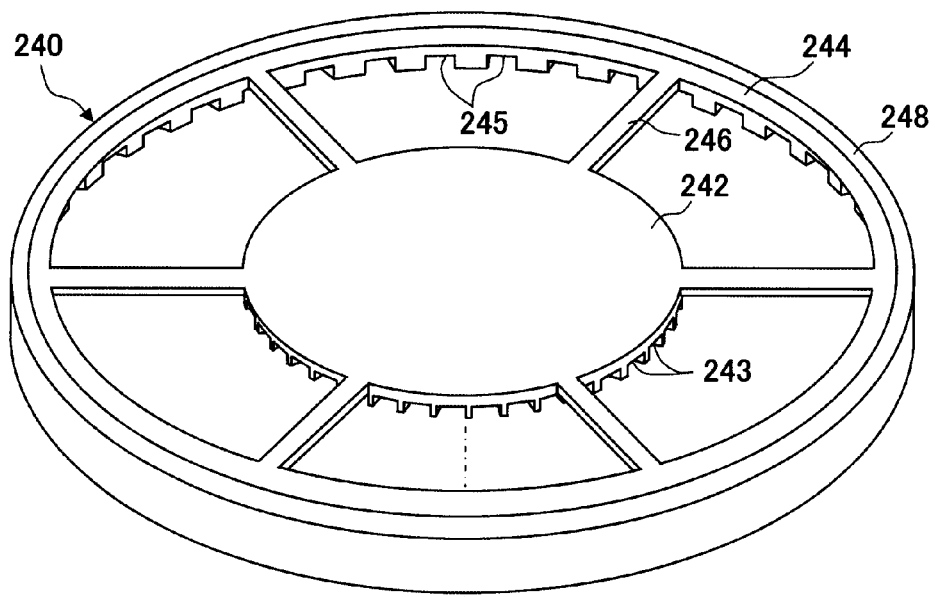
FIG. 3 is a perspective illustrating how the barrier wall member in FIG. 2 may be assembled.
Figure 3:
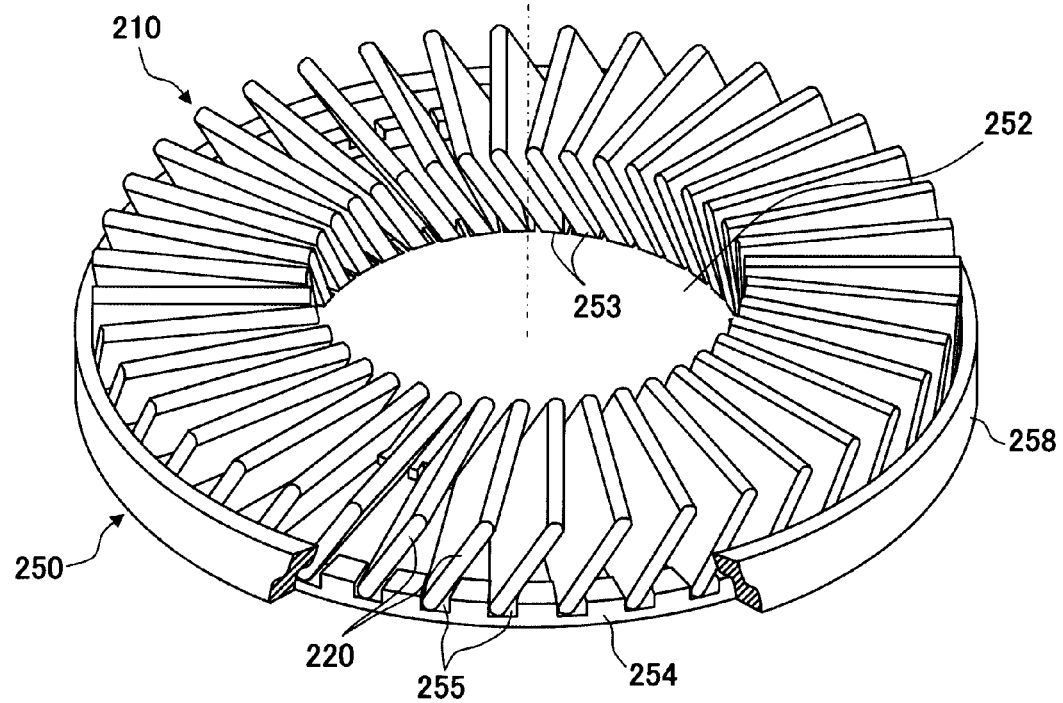
Figure 4:
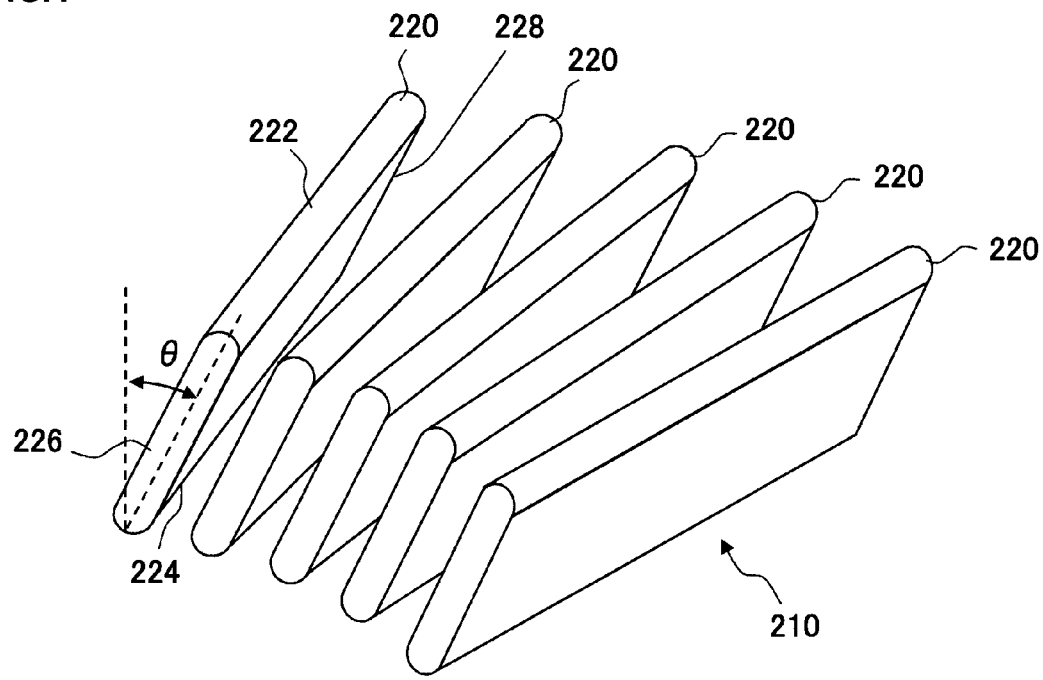
FIG. 4 shows some of the fin members in FIG. 2 in an enlarged perspective.
Figure 5:
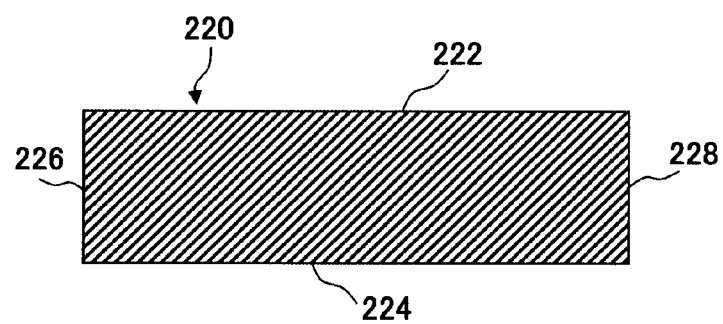
FIG. 5 is a longitudinal sectional view of one of the fin members in FIG. 2.
Figure 6:
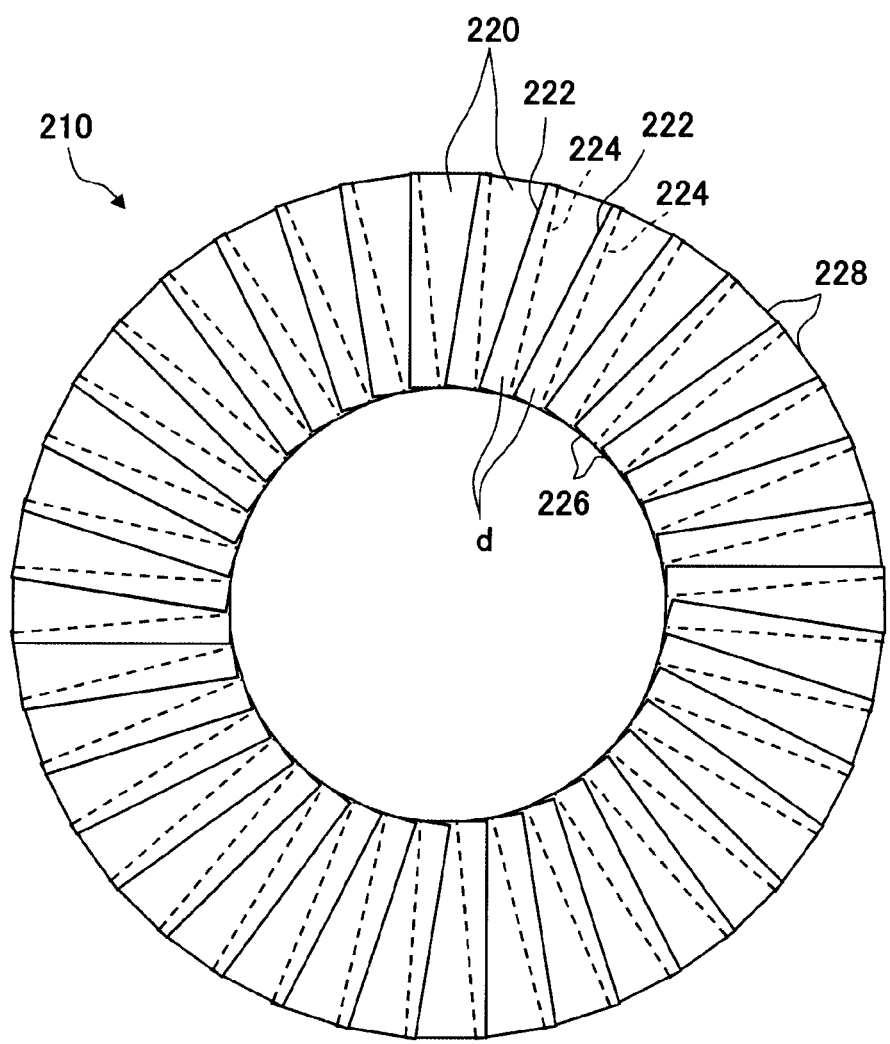
FIG. 6 is a plan view of the fin members shown in FIG. 2, taken from above.

Next, specific structural examples that may be adopted in the barrier wall member 200 in the embodiment are explained in reference to drawings. FIG. 2 is an external view of the barrier wall member achieved in the embodiment, illustrating a structural example that may be adopted in the barrier wall member in a perspective, whereas FIG. 3 is a perspective of the barrier wall member assembly with the upper support member disengaged from the bottom assembly. FIG. 4 is an enlarged perspective of some of the fin members and FIG. 5 is a longitudinal sectional view of a single fin member. FIG. 6 is a plan view of the fin members taken from above.

As shown in FIGS. 2 and 3, a barrier wall member 200 assumes a fin structure 210 constituted with numerous plate-like fin members 220 supported between an upper support member 240 and a lower support member 250. The fin members extend from a central area toward the periphery and are disposed in a radial pattern. The fin members 220 in this example are each constituted with a plate member having a rectangular section, which includes an upper end portion 222 and a lower end portion 224 each rounded off, an inner-side end portion 226 located on the central side and an outer-side end portion 228 located along the peripheral edge side, as shown in FIGS. 4 and 5.

The fin members 220 are constituted of a material that does not transmit ultraviolet light. The term "ultraviolet light" is used in this context to refer to light with a smaller wavelength than that of visible light, which may damage the wafer. The ultraviolet light as referred to in the this description includes vacuum ultraviolet light with an even smaller wavelength, as well as solar ultraviolet light. In addition, it is desirable to form the fin members 220 by using an insulating material in order to prevent formation of particles due to, for instance, ion collisions. Such an insulating material, which does not transmit ultraviolet light, may be, for instance, aluminum oxide, yttrium oxide, aluminum nitride or quartz coated with a UV-resistant film, as well as a material containing silicon oxide such as quartz.

As shown in FIGS. 4 and 6, the fin members 220 are disposed along the circumferential direction with a uniform tilt angle θ so that adjacent fin members 220 overlap over the area ranging from the central area through the peripheral edge area with a gap formed between the adjacent fin members 220. More specifically, the fin members 220 each tilt so that the lower end portion 224 of a frontward fin member 20 and the upper end portion 222 of the adjacent rearward fin member 220 overlap each other. The presence of such overlapping areas d renders invisible the processing chamber 102 located further downstream relative to the fin members 220 in a plan view of the fin members 220 viewed from the upstream side where the plasma generation chamber 104 is present.

Figure 7:
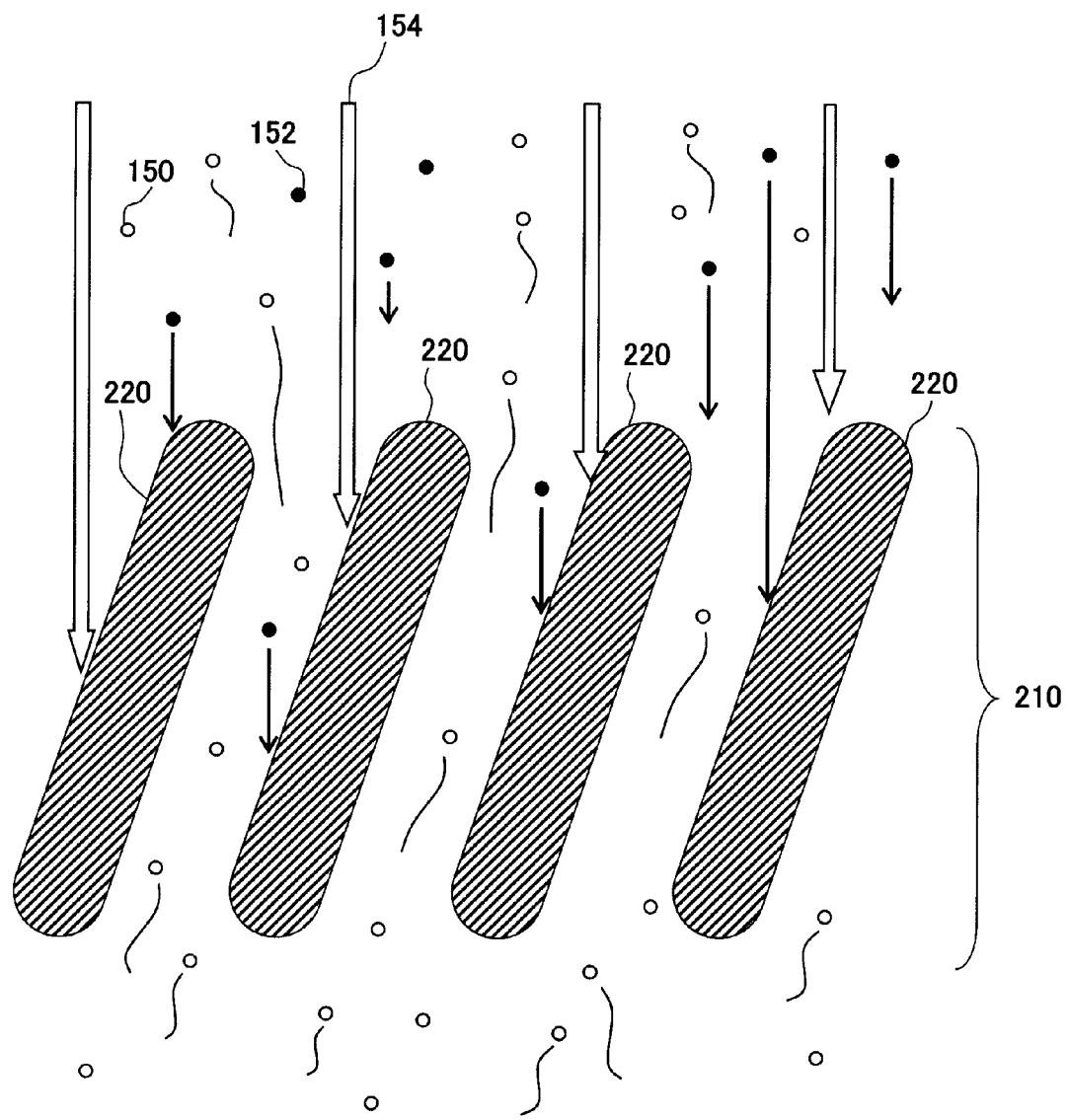
FIG. 7 illustrates the action promoted through the fin structure shown in FIG. 2.

By adopting this fin structure 210, it is possible to selectively allow hydrogen radicals alone to pass through while effectively blocking ultraviolet light and hydrogen ions with their pronounced tendency to propagate linearly. This feature is now explained in further detail in reference to drawings. FIG. 7 illustrates the action induced through the fin structure 210. FIG. 7 is a schematic sectional view of some of the fin members 220 taken longitudinally along the circumferential direction. It is to be noted that FIG. 7 provides a schematic illustration of hydrogen radicals 150, hydrogen ions 152 and ultraviolet light 154, so as to facilitate the explanation.

As illustrated in FIG. 7, as hydrogen plasma is generated in the plasma generation chamber 104, the fin structure 210 becomes exposed to a down-flow (gas flow) containing hydrogen radicals 150, hydrogen ions 152 and ultraviolet light 154 all originating from the hydrogen plasma. Of these, the hydrogen ions 152 and the ultraviolet light 154 with their pronounced tendency to propagate linearly, advance along the vertical direction and are blocked at the individual fin members 220.

The hydrogen radicals 150, on the other hand, do not have a pronounced tendency for linear propagation, unlike the hydrogen ions 152 and the ultraviolet light 154 and thus wander as they travel. For this reason, the hydrogen radicals 150 enter the gaps between the tilted fin members 220 and move beyond the fin members.

As described above, the hydrogen ions 152 and the ultraviolet light 154 are blocked at the barrier wall member 200 and the hydrogen radicals 150 alone pass through the barrier wall member 200 to enter the processing chamber 102. As a result, the hydrogen radicals 150 alone are supplied over to the surface of the wafer W placed on the stage 106 and the desired processing, such as ashing of a photoresist film on the wafer W, can be executed with the hydrogen radicals alone, without damaging the wafer W with the ultraviolet light or the hydrogen ions.

In addition, since the fin members 220 in the embodiment are made to range upward with a tilt, allowing the hydrogen radicals 150 to slip through the gaps between the fin members 220 with ease and to travel beyond the fin members with a very high level of efficiency. Furthermore, compared to a structure in the related art, which includes a shield plate with through holes formed therein disposed with a horizontal orientation, the hydrogen radicals 150 are allowed to pass through over a much greater area, further improving passage of the hydrogen radicals 150 compared to the related art. Since the fin members 220 range upward substantially against the direction of the down-flow, the hydrogen radicals 150 will not readily collide with the walls of the fin members 220 and instead, most of the hydrogen radicals 150 will advance downward. Consequently, the hydrogen radicals 150 are allowed to pass through with a higher level of efficiency over the related art, which is bound to improve the processing rate (e.g., the etching rate or the film formation rate) of the wafer processing.

(Comparison of Hydrogen Radical Passage Efficiency)

Figure 8A:
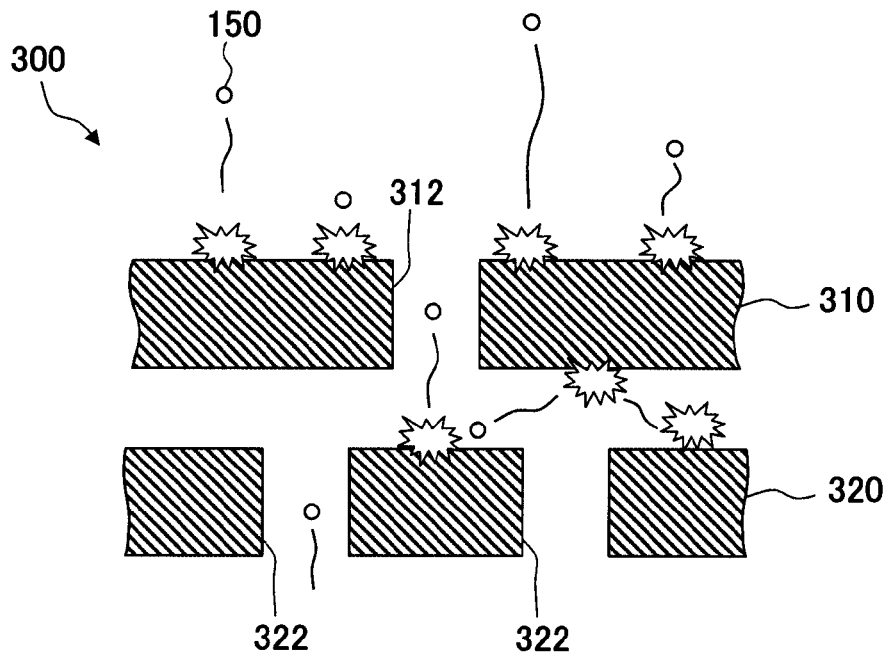
FIG. 8A illustrates the action related to the hydrogen radical passage efficiency, manifested at a barrier wall member in a reference example.
Figure 8B:
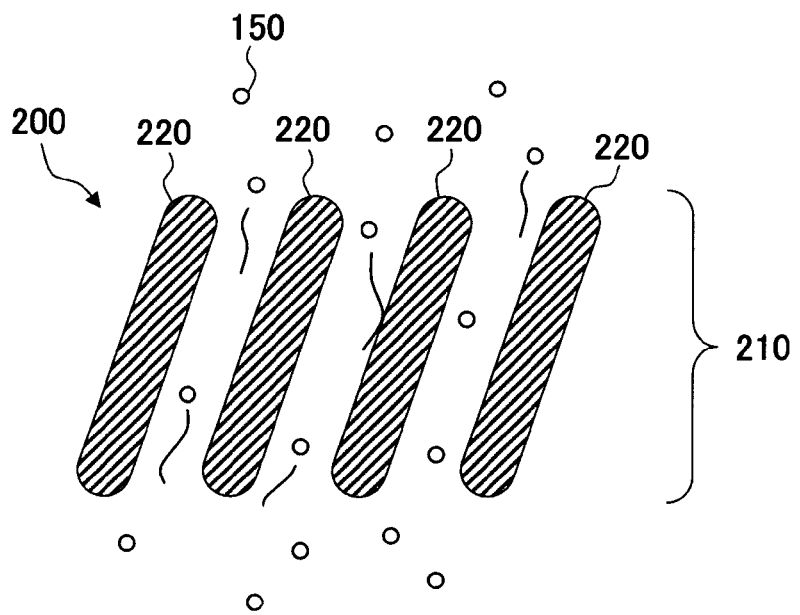
FIG. 8B illustrates the action related to the hydrogen radical passage efficiency, manifested at the barrier wall member in the embodiment.

The following is a detailed explanation of the hydrogen radical passage efficiency achieved at a barrier wall member assuming a fin structure such as that in the embodiment in comparison with the hydrogen radical passage efficiency achieved at a barrier wall member constituted with two barrier wall plates provided as a reference example. FIGS. 8A and 8B each illustrate action related to the hydrogen radical passage efficiency. A barrier wall member 300 shown in FIG. 8A includes two barrier wall plates 310 and 320 stacked one on top of the other with a horizontal orientation, with through holes 312 and 322 at the respective barrier wall plates 310 and 320 offset relative to each other so that the space under the barrier wall plates 310 and 320 is rendered invisible in a plan view. A barrier wall member 200 in FIG. 8B adopts the fin structure 210 in the embodiment. It is to be noted that FIG. 8A presents a longitudinal sectional view showing part of the barrier wall plates 310 and 320, whereas FIG. 8B is a longitudinal sectional view taken along the circumferential direction showing some of the fin members 220 achieved in the embodiment.

The hydrogen radicals 150, which do not readily travel linearly but rather wander as they advance, are likely to pass through the through holes 312 and 322 at the upper and lower barrier wall plates 310 and 320 constituting the barrier wall member 300 in the reference example presented in FIG. 8A.

However, since the barrier wall plates 310 and 320 are stacked one on top of the other with a horizontal orientation and the upper through holes 312 and the lower through holes 322 are offset relative to each other, the likelihood of the hydrogen radicals 150 colliding with the barrier wall plates 310 and 320, as shown in FIG. 8A, is very high. Under such circumstances, the hydrogen radicals will readily collide with the barrier wall plates substantially at a right angle to the barrier wall plates, which, in turn, is likely to lead to a loss of hydrogen radicals 150. For this reason, the hydrogen radicals 150 cannot pass through the barrier wall member efficiently and the passage rate of the hydrogen radicals 150 is bound to be significantly lower than the passage rate at a barrier wall member constituted with barrier wall plates having the upper and lower through holes 312 and 322 formed without an offset.

The fin members 220 in the embodiment are made to range upward with a tilt and thus, the hydrogen radicals 150 are allowed to pass through the gaps between the fin members 220 easily, as shown in FIG. 8B. Furthermore, the hydrogen radicals 150 do not readily collide with the wall surfaces of the fin members 220 and even in the event of collisions, the hydrogen radicals will contact the fin members 220 along the contour of the wall surfaces of the fin members 220 without colliding with the fin members substantially at a right angle. Thus, the extent of energy loss is minimized. Through these measures, the hydrogen radicals 150 are mostly allowed to advance downward. Ultimately, since the hydrogen radicals 150 are allowed to pass through the barrier wall member with a higher level of efficiency compared to the related art, the passage rate of the hydrogen radicals 150 is improved.

Figure 9A:
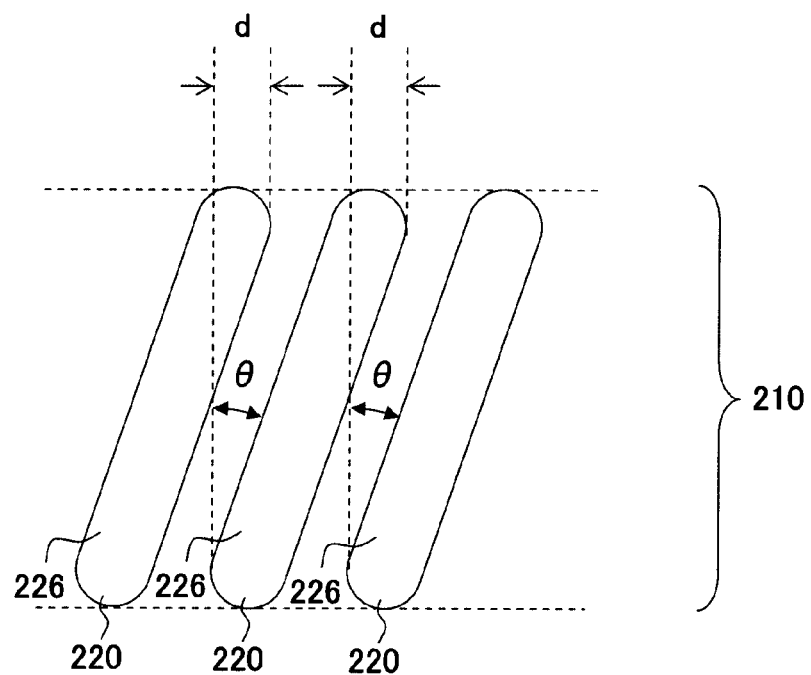
FIG. 9A illustrates the gaps formed on the central side between the fin members shown in FIG. 2.
Figure 9B:
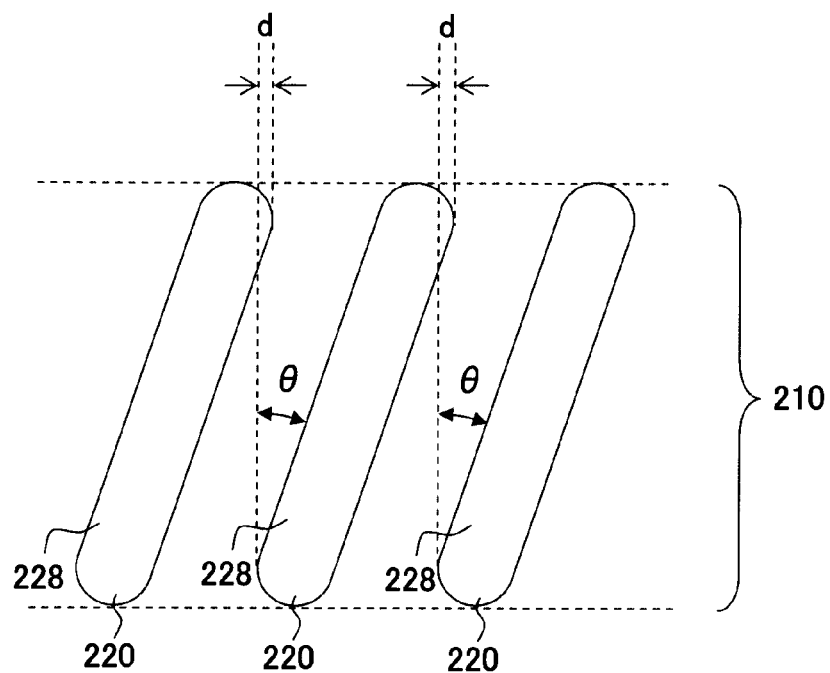
FIG. 9B illustrates the gaps formed on the peripheral side between the fin members shown in FIG. 2.

In the fin structure 210 achieved in the embodiment, constituted with the fin members 220 having a rectangular section and disposed in a radial pattern, the width of the gaps between the fin members 220 can be made to change gradually over the area ranging from the central area toward the periphery simply by tilting the fin members 220 with a uniform tilt angle θ along the circumferential direction. More specifically, while the gaps between the fin members 220 are narrower on the central side, as shown in FIG. 9A, the gaps between the fin members 220 widen toward the periphery, as shown in FIG. 9B.

In short, the width of the gaps between the individual fin members 220, which is the smallest on the central side, increases gradually over the area ranging from the central side toward the peripheral side so as to assume the largest width at the peripheral edge. The down-flow (gas flow) of the hydrogen radicals can move with greater ease over the area where the gaps between the individual fin members 220 are wider.

Accordingly, by disposing the fin members 220 with a rectangular section in a radial pattern with a tilt along the circumferential direction, the down-flow of the hydrogen radicals is allowed to move with greater ease through the fin structure 210, i.e., the conduction of the hydrogen radicals can be made to increase gradually from the central area toward the periphery. Thus, even when the flow velocity distribution of the down-flow would otherwise assume a substantially parabolic curve with the flow velocity gradually decreasing as the down-flow moves from the central area toward the periphery, the presence of such a fin structure 210 regulates the flow of the hydrogen radicals so that a substantially uniform overall flow velocity distribution is achieved from the central area through to the periphery.

It is to be noted that when the fin members 220 with a rectangular section are disposed in a radial pattern, the extent of the overlap d with which the fin members 220 overlap on the central side does not match the extent of overlap d on the peripheral edge side. Namely, while the extent of overlap d at the individual fin members 220 is significant on the central side, as shown in FIG. 9A, the fin members 220 overlap to a lesser extent on the peripheral edge side, as shown in FIG. 9B. This means that the tilt angle θ for the fin members 220 should be set so as to assure an overlap d on the peripheral edge side, on which the extent of the overlap d is the smallest, in order to allow the fin members to overlap each other from the central side through to the peripheral edge side. Furthermore, since the gaps between the fin members 220 assume the greatest width when the tilt angle is selected as described above, the highest level of conduction is achieved as well.

(Comparison of Down-flow Velocity Distributions)

Figure 10A:
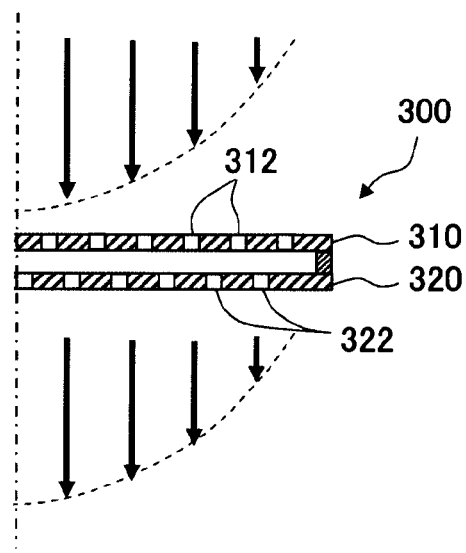
FIG. 10A illustrates the action related to the gas flow velocity distribution of the gas passing through a barrier wall member in a reference example.
Figure 10B:
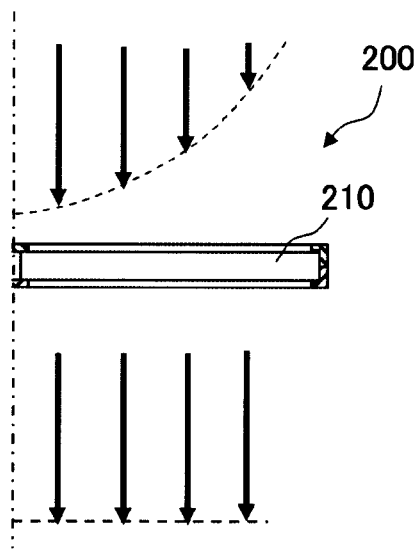
FIG. 10B illustrates the action related to the gas flow velocity distribution of the gas passing through the barrier wall member in the embodiment.

The following is a detailed explanation of the down-flow (gas flow) velocity distribution, observed before and after the gas passes through the barrier wall member 200 assuming the fin structure 210 in the embodiment, in comparison with the down-flow velocity distribution measured in conjunction with the barrier wall member achieved in the reference example described earlier. FIGS. 10A and 10B each illustrate action related to the down-flow velocity distribution. FIG. 10A schematically illustrates the barrier wall member 300 in the reference example in a sectional view, whereas FIG. 10B schematically illustrates the barrier wall member 200 achieved in the embodiment in a sectional view. The barrier wall member 300 in FIG. 10A is structurally similar to that shown in FIG. 8A. The barrier wall member 200 in FIG. 10B adopts the fin structure 210 achieved in the embodiment. It is to be noted that FIG. 10B does not include an illustration of the individual fin members 220.

At the barrier wall member 300 in the reference example shown in FIG. 10A, constituted with the two barrier wall plates 310 and 320 with the respective through holes 312 and 322 formed therein uniformly from the central area toward the periphery, the gas flows without changing its flow velocity before and after passing through the barrier wall member both on the central side and the peripheral edge side. This means that if the flow velocity on the periphery tends to be lower than that toward the center in the down-flow velocity distribution, as shown in FIG. 10A, the down-flow velocity distribution of the gas passing through the through holes 312 and the through holes 322 cannot be rendered uniform over the entire area ranging from the central side through to the peripheral edge side.

In contrast, at the barrier wall member 200 assuming the fin structure 210 in the embodiment, the ease of gas flow is gradually increased toward the peripheral side relative to the central area. Thus, even when the flow velocity on the peripheral edge side is lower than that on the central side in the down-flow velocity distribution prior to passing through the barrier wall member 200, the flow velocity distribution of the down-flow of the gas is rendered substantially uniform from the central side through the peripheral edge side after passing through the barrier wall member 200. As a result, hydrogen radicals are carried in the down-flow from the central side toward the peripheral edge side within the wafer plane and are thus supplied evenly, enabling uniform processing over the entire range within the wafer plane. Consequently, better in-plane uniformity with regard to the wafer processing rate (e.g., the etching rate or the film formation rate) or with regard to the processing results (e.g., formation of elements or holes in the intended shape at the wafer) is achieved.

Moreover, the fin structure 210 achieved in the embodiment allows the width of the gaps between the fin members 220, ranging from the central side through the peripheral edge side, to be adjusted by altering the tilt angle of the fin members 220. As a result, the conduction can be adjusted over the area from the central side through the peripheral edge side. Since the tilt angle of the fin members 220 can be linearly adjusted, the conduction, too, can be fine-adjusted along a linear curve.

For instance, the conduction can be increased to a greater extent by tilting the fin members 220 at an angle closer to a right angle and in such a case, the flow velocity, too, can be increased. Since the conduction can be linearly fine-adjusted with ease simply by altering the tilt angle of the fin members 220, the down-flow velocity distribution can also be fine-adjusted with greater ease.

Different flow velocities may be achieved on the central side and the peripheral edge side of the barrier wall member 300 in the reference example constituted with the barrier plates shown in FIG. 10A by changing the quantity, the size, the positional arrangement or the like of the through holes 312 and 322 over the area ranging from the central side through the peripheral edge side. However, it is difficult to determine the optimal quantity, size, positional arrangement or the like for the through holes 312 and 322 in order to achieve the ideal down-flow velocity distribution. In addition, the ease with which the gas moves in the down-flow (conduction) cannot easily be fine-adjusted, and thus, the flow velocity cannot easily be fine-adjusted either.

While an explanation has been given above on an example in which the fin members 220 are each constituted with a plate member having a rectangular section, as shown in FIG. 5, the conduction may be adjusted over the area ranging from the central side through the peripheral edge side by using fin members 220 assuming a different shape. More specifically, the height of the upper end portion 222 of each fin member 220 may be adjusted at different positions in the area ranging from the central side through the peripheral edge side so as to adjust the height of the gaps between the fin members 220, which, in turn, makes it possible to adjust the conduction of the down-flow moving through the gaps.

Figure 11A:
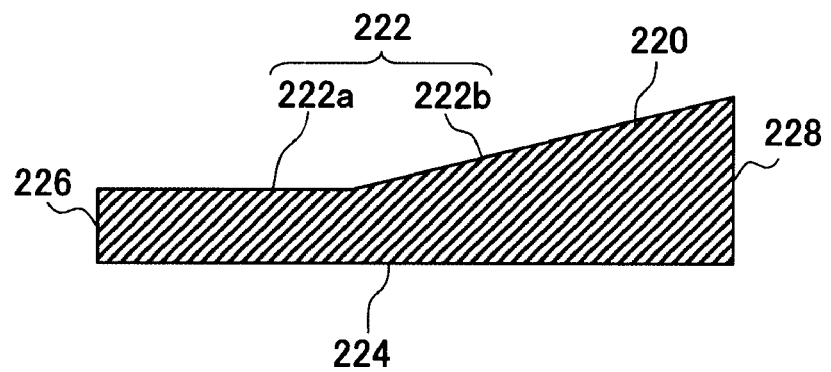
FIG. 11A is a longitudinal sectional view of a fin member adopting a shape achieved in a variation.
Figure 11B:
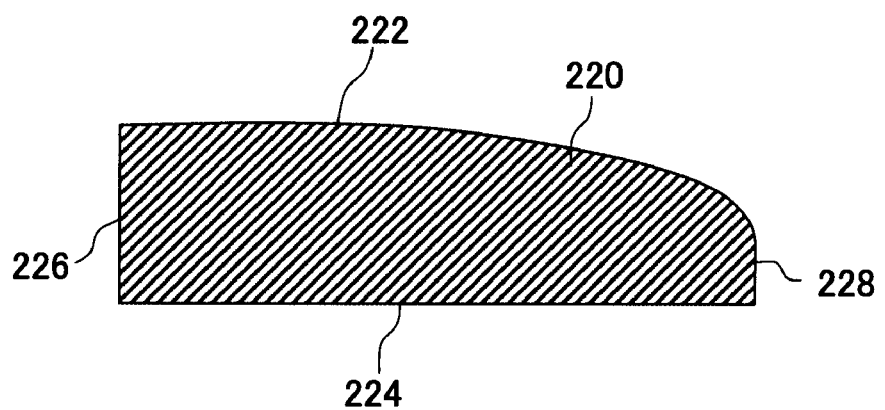
FIG. 11B is a longitudinal sectional view of a fin member adopting a shape achieved in another variation.

Such fin members 220 may assume a uniform height at the upper end portions 222 thereof over the area ranging from the central side through the peripheral end side, as shown in FIG. 5, or the fin members 220 may each assume a shape with the height of the upper end portion 222 changing from the central side toward the peripheral side, as shown in FIG. 11B to be referred to later. As an alternative, the fin members 220 may each assume a shape that includes a portion where the upper end portion 222 sustains a uniform height and a portion where the height of the upper portion 222 changes, over the area ranging from the central side through the peripheral edge side, as shown in FIG. 11A to be referred to later. Through these measures, the down-flow velocity distribution of the gas having passed between individual fin members 220 can be controlled freely.

For instance, a flow velocity distribution with the flow velocity lowered further toward the peripheral edge side relative to the central side may be achieved by using fin members 220 formed in the shape shown in FIG. 11A. FIG. 11A presents a longitudinal sectional view of a single fin member 220, similar to that presented in FIG. 5. FIG. 11A shows a fin member 220 ranging from the central side to the peripheral edge side, which is divided into portion A and portion B, with portion A ranging levelly by sustaining a uniform height at its upper end 222a, which is smaller than the height assumed at the upper end in FIG. 5 and portion B linearly inclining toward the peripheral edge side so that the height at the upper end 222b of portion B, initially equal to the height at the upper end 222a of portion A, gradually increases toward the peripheral edge side. In this structure, the upper end 222a at portion A on the central side assumes a small height and thus, the conduction is at its greatest over portion A. Over portion B located on the peripheral edge side, the conduction becomes gradually lower toward the peripheral edge. Through these measures, the flow velocity can be lowered to a greater extent further toward the peripheral edge relative to the central side.

If, on the other hand, if a flow velocity distribution whereby the flow velocity changes in a parabolic curve from the central side toward the peripheral side needs to be achieved, the fin members 220 may assume a shape such as that shown in FIG. 11B. FIG. 11B shows a fin member 220, the height measured at the upper end 222 thereof gradually decreasing in a parabolic curve over the area ranging from the central side through the peripheral edge side of the fin member. In this case, the conduction is made to decrease to a greater extent further toward the peripheral edge, thereby achieving a parabolic flow velocity distribution over the area ranging from the central side through the peripheral edge side.

It is to be noted that the size of the gaps between the fin members 220 may be adjusted by altering the quantity of fin members 220, the thickness of the fin members 220 or the like, instead of the height of the fin members 220. The quantity, the height, the thickness and the like of the fin members 220 are not limited to those described above or those illustrated in the figures (Support Member)

Next, in reference to drawings, the upper support member 240 and the lower support member 250 that together support the fin members 220 constituting the fin structure 210 described above are explained. As shown in FIGS. 2 and 3, the fin structure 210 in the embodiments is supported by the upper support member 240 and the lower support member 250 holding the fin structure between them. The upper support member 240 and the lower support member 250 are allowed to rotate relative to each other while holding the fin members 220, so as to adjust the tilt angle of the fin members 220 as the upper support member 240 and the lower support member 250 rotate relative to each other.

The following is a detailed explanation of a structural example that may be adopted in the upper support member 240 and the lower support member 250. The upper support member 240 includes a disk-shaped upper inner plate 242 that closes off a central area of the barrier wall member 200 and a ring-shaped upper outer plate 244 disposed over the peripheral edge. The upper inner plate 242 and the upper outer plates 244 are linked via a plurality of elongated spacer portions 246. A plurality of inner grooves 243 are formed over the entire circumference of the outer edge at the lower surface of the upper inner plate 242, whereas a plurality of outer grooves 245 are formed in correspondence to the inner grooves 243, over the entire circumference of the inner edge at the lower surface of the upper outer plate 244. A tubular side plate 248 encloses the upper outer plate 244 on the outside thereof. It is to be noted that the upper support member 240 may be formed as an integrated unit, or the individual members to constitute the upper support member 240 may be provided as separate components and they may be connected together.

While the lower support member 250 adopts a structure similar to that of the upper support member 240, grooves are formed on the side opposite from that on which the grooves at the upper support member 240 are formed. Namely, the lower support member 250 includes a disk-shaped lower inner plate 252 that closes off the central area of the barrier wall member 200 and a ring-shaped lower outer plate 254 disposed over the peripheral edge. A plurality of inner grooves 253 are formed over the entire circumference of the outer edge at the upper surface of the lower inner plate 252, whereas a plurality of outer side grooves 255 are formed in correspondence to the inner grooves 253, over the entire circumference of the inner edge at the upper surface of the lower outer plate 254. A tubular side plate 258 encloses the lower outer plate 254 on the outside thereof. While not visible in FIG. 3, the lower inner plate 252 and the lower outer plate 254 are linked via a plurality of elongated spacer portions similar to those at the upper support member 240. It is to be noted that the lower support member 240 may be formed as an integrated unit or the individual members to constitute the upper support member 250 provided as separate components may be connected together.

By using the upper support member 240 and the lower support member 250 structured as described above, the ends of the individual fin members 220 on the central side can be held with play in the inner grooves 243 and 253 between the upper inner plate 242 and the lower inner plate 252 and the ends of the fin members 220 on the peripheral edge side can be held with play in the outer grooves 245 and 255 between the upper outer plate 244 and the lower outer plate 254. This structure allows the tilt angle of the fin members 220 to be altered with ease as the upper support member 240 is rotated relative to the lower support member 250.

Figure 12A:
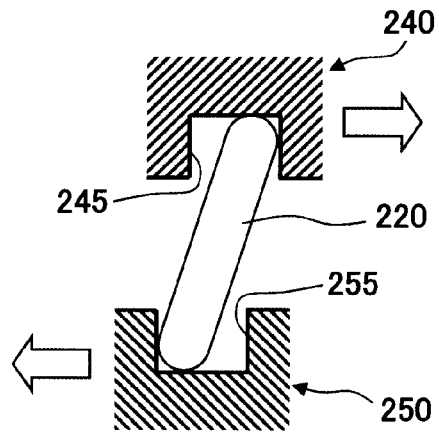
FIG. 12A illustrates how the fin member tilt angle may be adjusted in the embodiment.
Figure 12B:
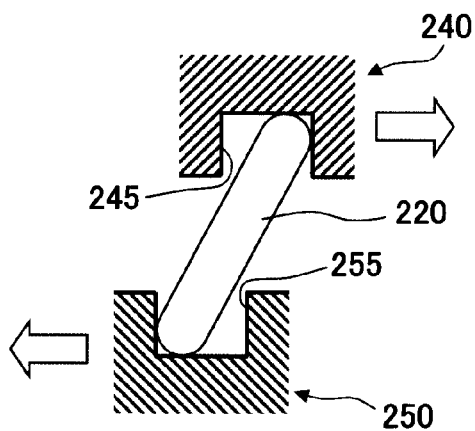
FIG. 12B illustrates how the fin member tilt angle may be adjusted in the embodiment.
Figure 12C:
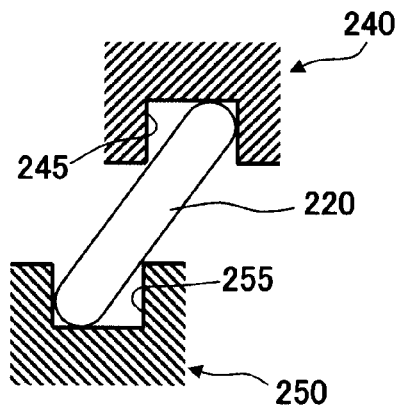
FIG. 12C illustrates how the fin member tilt angle may be adjusted in the embodiment.

For instance, when the tilt angle off the fin members 220 tilted as shown in FIG. 12A is to be increased, the upper support member 240 is rotated relative to the lower support member 250 so as to gradually increase the tilt angle of the fin members 220 in correspondence to the rotational angle of the upper support member 240 relative to the lower support member 250, as shown in FIGS. 12B and 12C. It is to be noted that since the upper end portions 222 and the lower end portions 224 of the fin members 220 coming into contact with the inner grooves 243 and 253 and the outer grooves 245 and 255 are formed as curved surfaces, the tilt of the fin members 220 can be adjusted smoothly.

In addition, since the hole at the center of the fin structure 210 is closed off by the inner plates 242 and 252, as shown in FIG. 3, transmission of ultraviolet light or ions through the central area is prevented. While hydrogen radicals cannot pass through the area closed off by the inner plates 242 and 252 either, part of the down-flow of the gas having passed between the fin members 220 travels over to the central area and thus, the overall down-flow, which is to ultimately reach the wafer W, is not greatly affected. By closing off the central area where the down-flow velocity would otherwise be at its highest, even better uniformity in the flow velocity distribution may be achieved. It is to be noted that the diameter of the hole formed at the center of the fin structure 210 can be set to the smallest possible value by adjusting the quantity of fin members, the height of the fin members and the tilt angle of the fin members.

Figure 13:
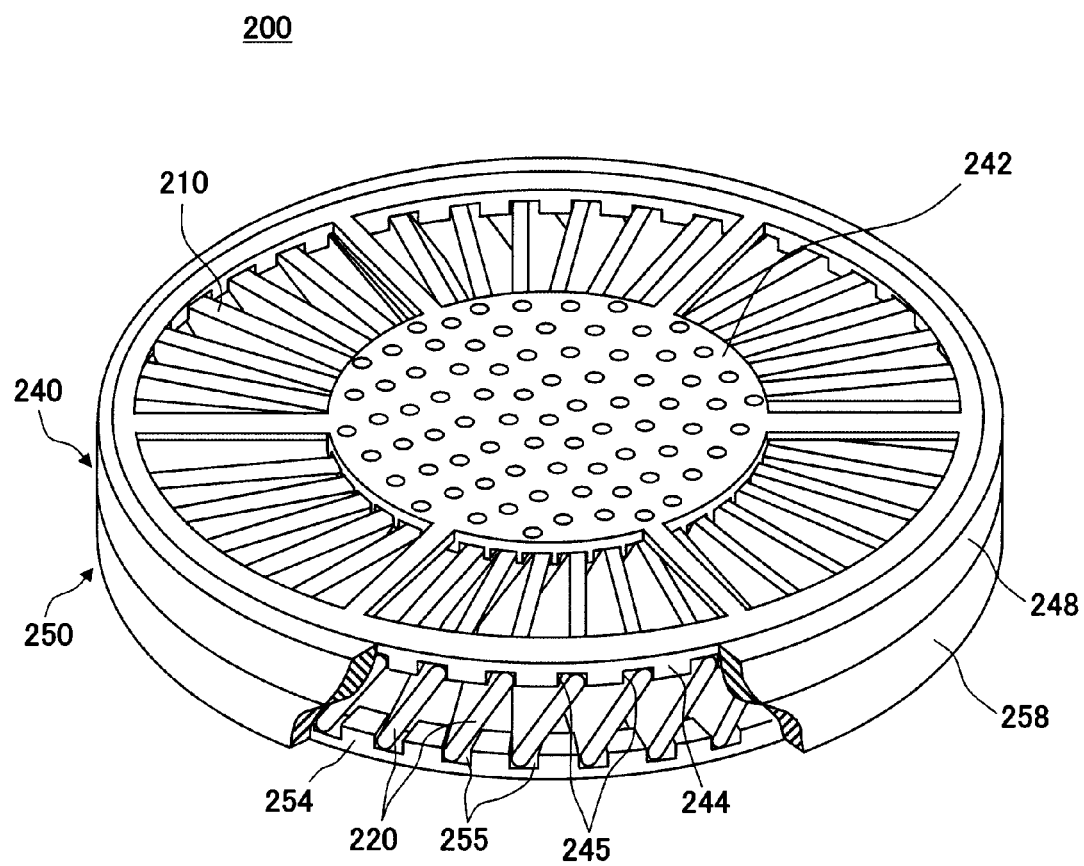
FIG. 13 is a perspective showing an external appearance of a barrier wall member constituted with an upper support member and a lower support member achieved as a variation of those in the embodiment.

In addition, through holes may be formed at the inner plates 242 and 252, as shown in FIG. 13. In such a case, it is desirable that the through holes at the inner plate 242 and the through holes at the inner plate 252 be offset relative to each other so that they do not overlap in a plan view. Through these measures, hydrogen radicals alone can be allowed to pass through the inner plates 242 and 252 while ultraviolet light and hydrogen ions are blocked at the inner plates. The quantity and the shape of through holes formed at the inner plates 242 and 252 are not limited to those shown in FIG. 13 and slits instead of through holes may be formed at the inner plates.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, the present invention may be adopted in any of various types of plasma processing apparatuses that execute different types of plasma processing on processing target substrates, such as etching and film formation, as well as ashing. In addition, the present invention may be adopted in a remote plasma-type plasma generation chamber in which plasma is generated in a space distanced from the wafer W, instead of the down-flow-type plasma generation chamber described above.

What is claimed is:

1. A plasma processing apparatus that executes a specific type of processing on a processing target substrate with radicals generated by raising a processing gas to plasma, comprising:
   a plasma generation chamber where plasma is generated by exciting the processing gas;
   a processing chamber disposed continuously to said plasma generation chamber;
   a stage disposed inside said processing chamber, upon which the processing target substrate is placed; and
   a barrier wall member separating said plasma generation chamber from said processing chamber, wherein:
   said barrier wall member is formed by disposing at a peripheral edge area thereof numerous plate-like fin members in a radial pattern so as to extend from a central area of said barrier wall member toward the peripheral edge area;
   said fin members are positioned so that an upper end portion of each fin member overlaps a lower end portion of an adjacent fin member, said fin members each range upward with a tilt along the circumferential direction with a gap formed between each fin member and an adjacent fin member, and said fin members are supported by an upper support member and a lower support member so that central side ends and peripheral side ends of said fin members are held between said upper support members and said lower support members; and
   as said upper support member and said lower support member are offset relative to each other by turning said upper support member and said lower support member relative to each other, the tilt angles of said fin members adjust together.

2. A plasma processing apparatus according to claim 1, wherein:
   said fin members having a shape with an upper end portion thereof sustaining a uniform height over an area ranging from a central side toward a peripheral side.

3. A plasma processing apparatus according to claim 1, wherein:
   said fin members having a shape, the height of an upper end portion of which changes over an area ranging from a central side toward a peripheral side.

4. A plasma processing apparatus according to claim 1, wherein:
   said fin members having a shape, the height of an upper end portion of which remains constant at a portion thereof but changes at another portion thereof, over an area ranging from a central side toward a peripheral side.

5. A plasma processing apparatus according to claim 1, wherein:
   said upper support member includes a disk-shaped upper inner plate and a ring-shaped upper outer plate and said lower support member includes a disk-shaped lower inner plate and a ring-shaped lower outer plate; and
   as the central-side ends of said fin members are fitted with play inside grooves formed at outer peripheral edges of said upper inner plate and said lower inner plate and the peripheral-side ends of said fin members are fitted with play inside grooves formed at said inner peripheral edges of said upper outer plate and said lower outer plate, said fin members become tiltably supported.

6. A plasma processing apparatus according to claim 5, wherein:
   through holes are formed at both said upper inner plate and said lower inner plate, with the through holes at said upper inner plate and said through holes at said lower inner plate formed with an offset so as to be not aligned with each other in a plan view.

\* \* \* \* \*